United States Patent
Chen

(10) Patent No.: US 8,102,180 B2
(45) Date of Patent: Jan. 24, 2012

(54) CPU VOLTAGE TESTING SYSTEM AND METHOD THEREOF

(75) Inventor: Cheng-Chi Chen, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 424 days.

(21) Appl. No.: 12/507,811

(22) Filed: Jul. 23, 2009

(65) Prior Publication Data
US 2010/0325499 A1    Dec. 23, 2010

(30) Foreign Application Priority Data
Jun. 19, 2009   (CN) .......................... 2009 1 0303444

(51) Int. Cl.
*G01R 31/02*  (2006.01)
*G01R 31/30*  (2006.01)
*G01R 27/28*  (2006.01)
*G06F 11/00*  (2006.01)

(52) U.S. Cl. ............... 324/522; 324/762.01; 714/100; 714/745; 702/118

(58) Field of Classification Search ............ 324/522, 324/713, 762.01; 702/118, 124, 126, 182–183; 714/10, 100, 745
See application file for complete search history.

(56) References Cited

U.S. PATENT DOCUMENTS
2004/0054936 A1*   3/2004   Dwyer et al. ............... 713/300
\* cited by examiner

*Primary Examiner* — Melissa Koval
*Assistant Examiner* — Farhana Hoque
(74) *Attorney, Agent, or Firm* — Altis Law Group, Inc.

(57) ABSTRACT

A CPU voltage testing system and method uses a parameter storing unit to store a number of VID codes and a plurality of allowable voltage ranges. A number of VID code control signals corresponding to the number of the VID codes are sent to a VID code coding unit to control a voltage converting module to output corresponding voltage signals to a CPU. A voltage collecting unit collects CPU core voltages of the CPU and outputs the collected CPU core voltages to a data processing unit. The data processing unit can determine whether the collected CPU core voltages are within the plurality of allowable voltage ranges via comparing with a number of testing parameters stored in the parameter storing unit.

6 Claims, 4 Drawing Sheets

CPU VOLTAGE TESTING SYSTEM AND METHOD THEREOF

BACKGROUND

1. Technical Field

The present disclosure relates to test systems and test methods and, particularly, to a test system and a test method for testing voltages of a central processing unit (CPU).

2. Description of Related Art

CPU core voltages (usually labeled $V_{CORE}$) are power supply voltages supplied to CPUs. When a CPU is used at startup, a pulse-width modulation (PWM) controller receives a voltage identification (VID) code from a number of VID pins of the CPU, and then outputs a corresponding PWM signal according to the VID code to a voltage regulation module (VRM). The voltage regulation module provides a required constant CPU core voltage to the CPU according to the VID code.

After manufacturing but before shipping, the CPU core voltage provided by the VRM should be tested. In an ordinary test method, the CPU core voltage is manually checked with a voltmeter, which is unduly laborious and time-consuming, and the result may not be accurate.

DETAILED DESCRIPTION

Figure 1:
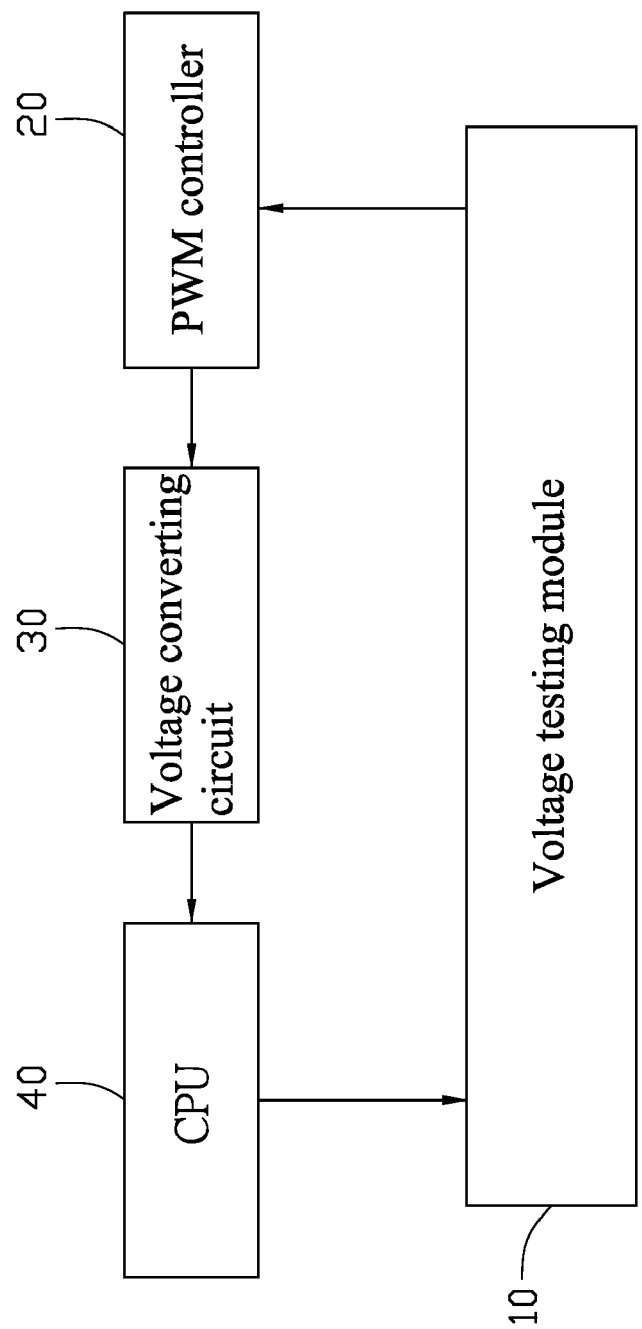
FIG. 1 is a block diagram of an exemplary embodiment of a CPU voltage testing system including a voltage testing module.
Figure 2:
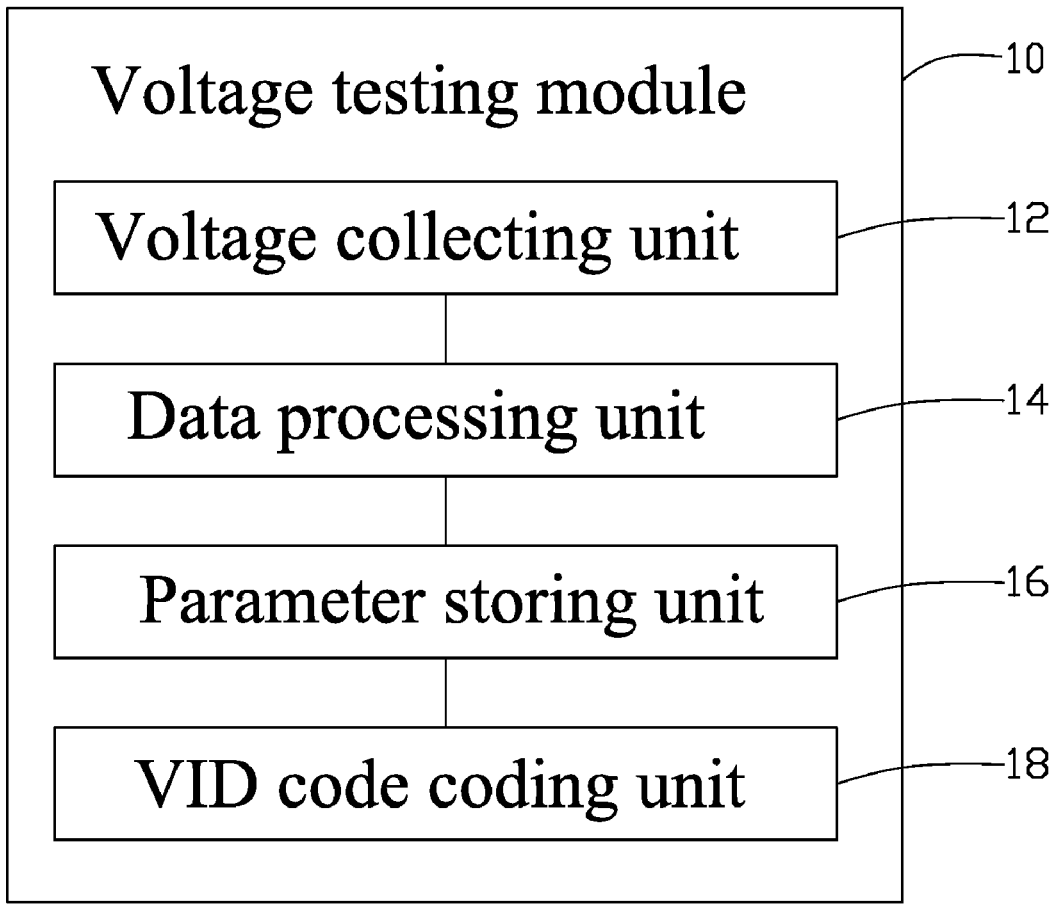
FIG. 2 is a block diagram of an exemplary embodiment of the voltage testing module of FIG. 1.

Referring to FIGS. 1 and 2, an exemplary embodiment of a central processing unit (CPU) voltage testing system 1 includes a voltage testing module 10, a pulse-width modulation (PWM) controller 20, a voltage converting module 30, and a CPU 40.

The voltage testing module 10 is used to measure CPU core voltages of the CPU 40 and includes a voltage collecting unit 12, a data processing unit 14, a parameter storing unit 16, and a voltage identification (VID) code coding unit 18. The CPU voltage testing system 1 is part of a computer motherboard, it may be understood that the computer motherboard also includes other parts, such as a south bridge chip, a north bridge chip, for example. These other parts are well-known technology, and so are not described here.

The parameter storing unit 16 stores a plurality of testing parameters and may include a plurality of VID codes corresponding to a plurality of standard CPU core voltages of CPUs, a plurality of reference voltages corresponding to the plurality of VID codes, and an allowable error range.

The data processing unit 14 is used to output a plurality of VID code control signals to the VID code coding unit 18 according to the plurality of VID codes. The VID code coding unit 18 receives the VID code control signals and generates corresponding VID code signals, and sends the VID code signals to the PWM controller 20. The PWM controller 20 outputs corresponding PWM signals according to the VID code signals to the voltage converting circuit 30. The voltage converting circuit 30 outputs corresponding voltage signals to the CPU 40 according to the PWM signals. The voltage collecting unit 12 collects CPU core voltages of the CPU 40 and outputs the collected CPU core voltages to the data processing unit 14. The data processing unit 14 processes the collected voltages and outputs testing results according to the testing parameters stored in the parameter storing unit 16.

Figure 3A:
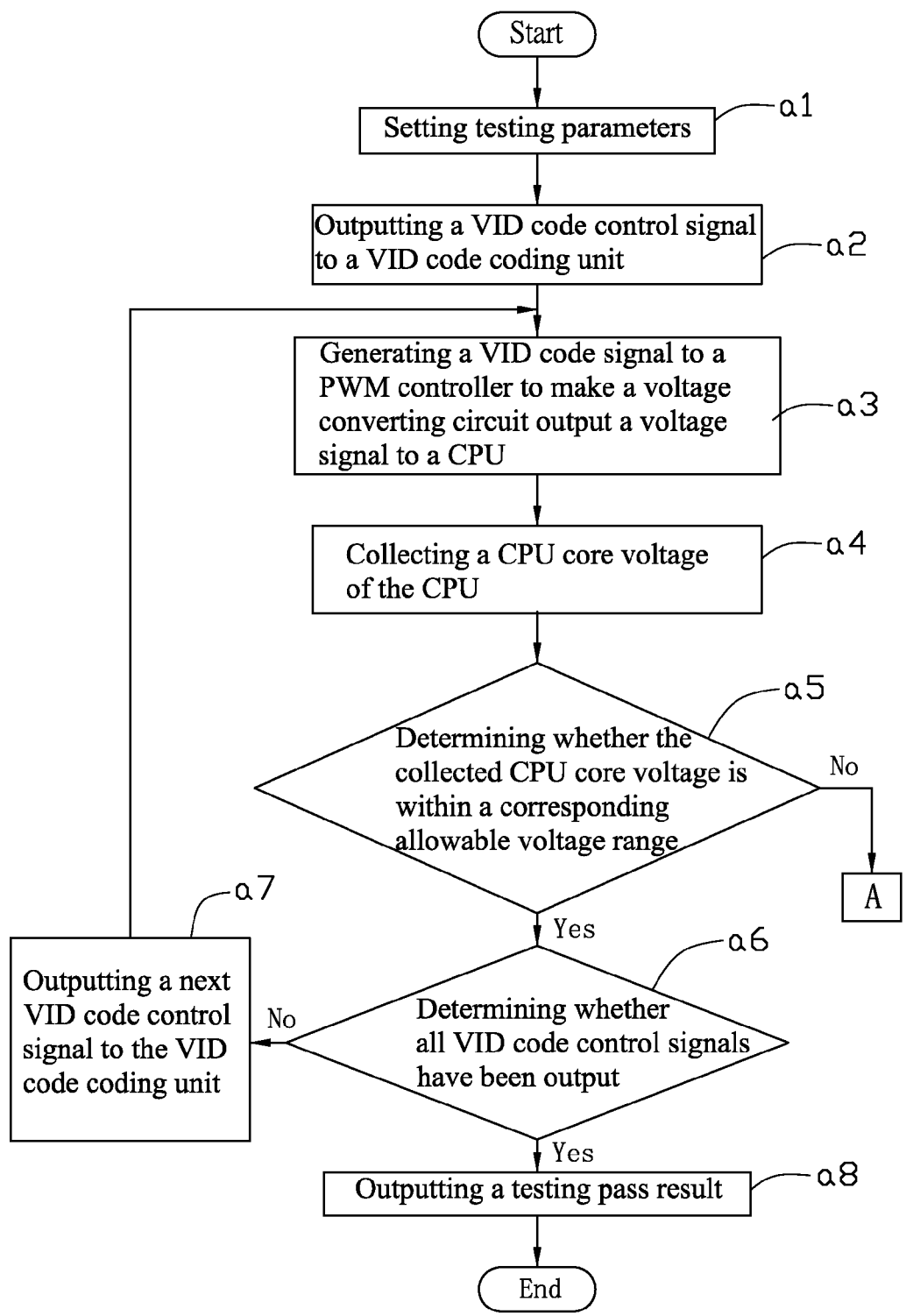
FIGS. 3A and 3B are a flowchart of an exemplary embodiment of a CPU voltage testing method.
Figure 3B:
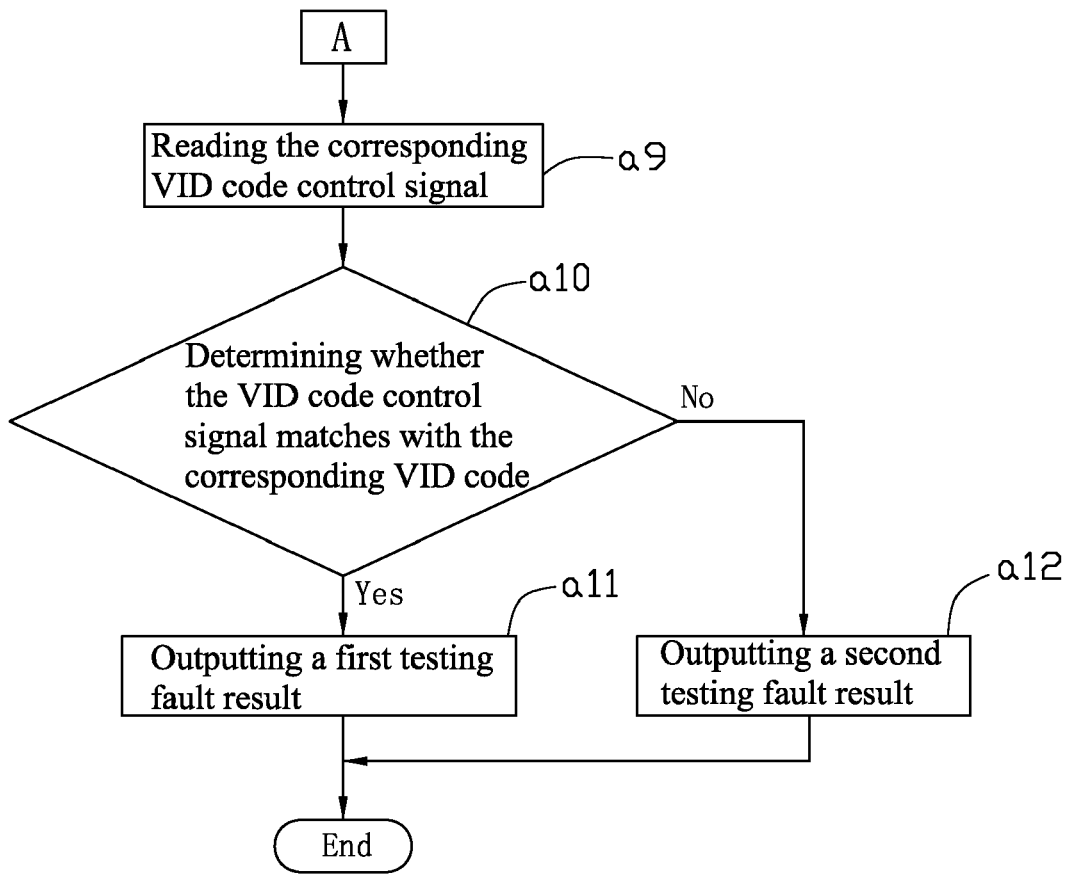

Referring to FIGS. 3A and 3B, an exemplary embodiment of a CPU voltage testing method applied in the CPU voltage testing system 1 includes the following steps.

In step a1, a plurality of testing parameters are set in the parameter storing unit 16. In one embodiment, the testing parameters may include a plurality of VID codes, a plurality of reference voltages corresponding to the plurality of VID codes, and an allowable error range such as (−0.03V, +0.03V). An allowable voltage range can be calculated by the corresponding reference voltage and the allowable error range, for example, if a VID code is 00000010, the corresponding reference voltage is about 1.6V, the corresponding allowable voltage range is about (1.57V, 1.63V).

In step a2, the data processing unit 14 outputs a VID code control signal to the VID code coding unit 18 according to a corresponding VID code of the plurality of VID codes stored in the parameter storing unit 16.

In step a3, the VID code coding unit 18 generates a corresponding VID code signal according to the VID code control signal and sends the VID code signal to the PWM controller 20. The PWM controller 20 outputs a corresponding PWM signal according to the VID code signal to the voltage converting circuit 30. The voltage converting circuit 30 outputs a corresponding voltage signal to the CPU 40 according to the PWM signal.

In step a4, the voltage collecting unit 12 collects a CPU core voltage of the CPU 40 and outputs the collected CPU core voltage to the data processing unit 14. In one embodiment, the voltage collecting unit 12 can collect a plurality of samples of the CPU core voltage in a predetermined period to improve testing precision, for example collect ten samples of the CPU core voltage in five seconds.

In step a5, the data processing unit 14 determines whether the collected CPU core voltage is within a corresponding allowable voltage range stored in the parameter storing unit 16. If the collected CPU core voltage is within the corresponding allowable voltage range, the process goes to step a6. If the collected CPU core voltage is not within the corresponding allowable voltage range, the process goes to step a9.

In step a6, the data processing unit 14 determines whether all VID code control signals have been output. If all VID code control signals have been output, the process goes to step a8. If all VID code control signals have not been output, the process goes to step a7.

In step a7, the data processing unit 14 outputs a next VID code control signal to the VID code coding unit 18.

In step a8, the data processing unit 14 outputs a testing pass result which shows the all tested CPU core voltages are within the corresponding allowable voltage ranges stored in the parameter storing unit 16.

In step a9, the data processing unit 14 reads the corresponding VID code control signal generated by the VID code coding unit 18.

In step a10, the data processing unit 14 determines whether the VID code control signal matches with the corresponding VID code stored in the parameter storing unit 16. If the VID code control signal matches with the corresponding VID code, the process goes to step a11. If the VID code control signal does not match with the corresponding VID code, the process goes to step a12.

In step a11, the data processing unit 14 outputs a first testing fault result which shows the voltage converting module 30 is abnormal.

In step a12, the data processing unit 14 outputs a second testing fault result which shows the transmitting channel between the data processing unit 14 and the VID code coding unit 18 is abnormal.

The CPU voltage testing system 1 and the testing method thereof can conveniently tested CPU core voltages of the CPU 40.

It is to be understood, however, that even though numerous characteristics and advantages of the present disclosure have been set forth in the foregoing description, together with details of the structure and function of the disclosure, the disclosure is illustrative only, and changes may be made in details, especially in matters of shape, size, and arrangement of parts within the principles of the disclosure to the full extent indicated by the broad general meaning of the terms in which the appended claims are expressed.

What is claimed is:

1. A central processing unit (CPU) voltage testing system to test CPU core voltages of a CPU, the testing system comprising:
   a pulse-width modulation (PWM) controller to receive voltage identification (VID) code signals to output corresponding PWM signals;
   a voltage converting module to receive the PWM signals to output corresponding voltage signals to the CPU; and
   a voltage testing module, comprising:
      a parameter storing unit storing a plurality of VID codes and a plurality of allowable voltage ranges;
      a data processing unit to output a plurality of VID code control signals according to the plurality of VID codes;
      a VID code coding unit to receive the VID code control signals and generates corresponding VID code signals to the PWM controller; and
      a voltage collecting unit to collect CPU core voltages of the CPU and output the collected CPU core voltages to the data processing unit, wherein the data processing unit determines whether the collected CPU core voltages are within the plurality of allowable voltage ranges.

2. The CPU voltage testing system of claim 1, wherein the plurality of allowable voltage ranges are calculated by a plurality of reference voltages and an allowable error stored in the parameter storing unit, the plurality of allowable voltage ranges are equal to the plurality of reference voltages plus the allowable error, respectively.

3. The CPU voltage testing system of claim 1, wherein the voltage collecting unit collects the CPU core voltages of the CPU via collecting a plurality of samples of the CPU core voltages in a predetermined period.

4. A central processing unit (CPU) voltage testing method to test CPU core voltages of a CPU, the testing method comprising:
   a: outputting a voltage identification (VID) code control signal to a VID code coding unit according to a corresponding VID code stored in a parameter storing unit;
   b: generating a corresponding VID code signal according to the VID code control signal and sending the VID code signal to a pulse-width modulation (PWM) controller, so as to control the PWM controller to output a corresponding PWM signal according to the VID code signal to a voltage converting circuit, to control the voltage converting circuit to output a corresponding voltage signal to the CPU according to the PWM signal;
   c: collecting a CPU core voltage of the CPU and outputting the collected CPU core voltage to a data processing unit;
   d: determining whether the collected CPU core voltage is within a corresponding allowable voltage range, wherein the process goes to step e in response to the collected CPU core voltage being within the corresponding allowable voltage range, and the process goes to step h in response to the collected CPU core voltage being not within the corresponding allowable voltage range;
   e: determining whether all VID code control signals have been output, wherein the process goes to step g in response to all VID code control signals having been output, and the process goes to step f in response to all VID code control signals having not been output;
   f: outputting a next VID code control signal to the VID code coding unit;
   g: outputting a testing pass result which shows all the tested CPU core voltages are within the corresponding allowable voltage ranges;
   h, reading the corresponding VID code control signal generated by the VID code coding unit;
   i, determining whether the VID code control signal matches with the corresponding VID code, wherein the process goes to step j in response to the VID code control signal matching with the corresponding VID code, and the process goes to step k in response to the VID code control signal not matching with the corresponding VID code;
   j, outputting a first testing fault result which shows that the voltage converting module is abnormal; and
   k, outputting a second testing fault result which shows that the transmitting channel between the data processing unit and the VID code coding unit is abnormal.

5. The CPU voltage testing method of claim 4, further comprising a step before step a: setting a plurality of VID codes and a plurality of allowable voltage ranges in the parameter storing unit.

6. The CPU voltage testing method of claim 5, wherein the plurality of allowable voltage ranges are calculated by a plurality of reference voltages and an allowable error stored in the a parameter storing unit, the plurality of allowable voltage ranges are equal to the plurality of reference voltages plus allowable error, respectively.

* * * * *